United States Patent
Yu et al.

(10) Patent No.: US 10,091,915 B2
(45) Date of Patent: *Oct. 2, 2018

(54) ELECTRONIC COMPONENT PACKAGE STRUCTURE AND ELECTRONIC DEVICE

(71) Applicant: Huawei Technologies Co., Ltd., Shenzhen (CN)

(72) Inventors: Xuequan Yu, Shanghai (CN); Lin Yang, Shenzhen (CN); Yadong Bai, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/790,992

(22) Filed: Oct. 23, 2017

(65) Prior Publication Data

US 2018/0049351 A1 Feb. 15, 2018

Related U.S. Application Data

(63) Continuation of application No. 14/687,511, filed on Apr. 15, 2015, now Pat. No. 9,839,167.

(30) Foreign Application Priority Data

Apr. 16, 2014 (CN) .......................... 2014 1 0152507

(51) Int. Cl.
*H05K 7/10* (2006.01)
*H05K 7/12* (2006.01)
(Continued)

(52) U.S. Cl.
CPC ........... *H05K 9/0028* (2013.01); *H01L 23/10* (2013.01); *H01L 23/552* (2013.01);
(Continued)

(58) Field of Classification Search
CPC . H01L 2224/16225; H01L 2224/73253; H01L 23/10; H01L 23/552;
(Continued)

(56) References Cited

U.S. PATENT DOCUMENTS

| | | |
|---|---|---|
| 4,996,097 A | 2/1991 | Fischer |
| 5,387,480 A | 2/1995 | Haluska et al. |

(Continued)

FOREIGN PATENT DOCUMENTS

| | | |
|---|---|---|
| CN | 1306476 A | 8/2001 |
| CN | 1774804 A | 5/2006 |

(Continued)

OTHER PUBLICATIONS

Machine Translation and Abstract of Chinese Publication No. CN102118674, Jul. 6, 2011, 10 pages.

(Continued)

*Primary Examiner* — Yuriy Semenenko
(74) *Attorney, Agent, or Firm* — Conley Rose, P.C.

(57) ABSTRACT

An electronic component package structure includes at least a substrate having a set attachment area for attaching an electronic component; a conductive lid having a top and a sidewall that extends toward the substrate, where one side of the sidewall close to the substrate has a bonding end, where the bonding end bonds the conductive lid to the substrate by using a non-conductive adhesive, and the conductive lid bonded to the substrate encloses the attachment area and forms a shielding space over the attachment area; and the non-conductive adhesive is located between the substrate and the bonding end.

10 Claims, 8 Drawing Sheets

(51) Int. Cl.
*H05K 9/00* (2006.01)
*H05K 1/18* (2006.01)
*H05K 1/02* (2006.01)
*H01L 23/552* (2006.01)
*H01L 23/10* (2006.01)

(52) U.S. Cl.
CPC ......... *H05K 1/0231* (2013.01); *H05K 1/0236* (2013.01); *H05K 1/181* (2013.01); *H01L 2224/16225* (2013.01); *H01L 2224/73253* (2013.01); *H01L 2924/164* (2013.01); *H01L 2924/16151* (2013.01); *H01L 2924/16235* (2013.01); *H01L 2924/16251* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC . H01L 2924/16151; H01L 2924/16235; H01L 2924/16251; H01L 2924/164; H01L 2924/19041; H01L 2924/19042; H01L 2924/19043; H01L 2924/191
See application file for complete search history.

(56) References Cited

U.S. PATENT DOCUMENTS

| | | |
|---|---|---|
| 5,763,824 A | 6/1998 | King et al. |
| 6,051,888 A | 4/2000 | Dahl |
| 6,518,660 B2 | 2/2003 | Kwon et al. |
| 6,614,102 B1 | 9/2003 | Hoffman et al. |
| 6,740,959 B2 | 5/2004 | Alcoe et al. |
| 6,956,285 B2 | 10/2005 | Radu et al. |
| 7,109,410 B2 | 9/2006 | Arnold et al. |
| 8,178,956 B2 * | 5/2012 | Do .................... H01L 23/552 257/659 |
| 8,664,751 B2 * | 3/2014 | Kim .................... H01L 23/552 257/659 |
| 9,129,954 B2 * | 9/2015 | Yen .................... H01L 23/498 |
| 9,839,167 B2 * | 12/2017 | Yu ...................... H01L 23/10 |
| 2002/0113306 A1 | 8/2002 | Kwon et al. |
| 2004/0170825 A1 | 9/2004 | Chung |
| 2004/0240191 A1 | 12/2004 | Arnold et al. |
| 2010/0096711 A1 | 4/2010 | Tian |
| 2011/0292621 A1 | 12/2011 | Beaumier et al. |
| 2012/0119346 A1 | 5/2012 | Im et al. |
| 2012/0193770 A1 | 8/2012 | Yamada et al. |
| 2015/0102473 A1 | 4/2015 | Yu et al. |
| 2015/0303881 A1 | 10/2015 | Blednov et al. |

FOREIGN PATENT DOCUMENTS

| | | |
|---|---|---|
| CN | 102118674 A | 7/2011 |
| CN | 102573279 A | 7/2012 |
| CN | 102623438 A | 8/2012 |
| CN | 102779811 A | 11/2012 |
| EP | 0806891 A1 | 11/1997 |

OTHER PUBLICATIONS

Foreign Communication From a Counterpart Application, Chinese Application No. 201410152507.9, Chinese Office Action dated Mar. 2, 2016, 8 pages.
Foreign Communication From a Counterpart Application, European Application No. 15163414.4, Extended European Search Report dated Aug. 19, 2015, 6 pages.

* cited by examiner

ELECTRONIC COMPONENT PACKAGE STRUCTURE AND ELECTRONIC DEVICE

This application is a continuation of U.S. patent application Ser. No. 14/687,511, now U.S. Pat. No. 9,839,167, filed on Apr. 15, 2015, which claims priority to Chinese Patent Application No 201410152507.9, now Chinese Patent No. 103943610, filed on Apr. 16, 2014. All of the afore-mentioned patent applications are hereby incorporated by reference in their entireties.

TECHNICAL FIELD

The present disclosure relates to the field of chip package technologies, and in particular, to an electronic component package structure and an electronic device.

BACKGROUND

As a speed and an integration level of a chip increase year by year, high-frequency Electromagnetic Interference (EMI) generated by the chip easily causes various problems that system interference and product Radiation Emission (RE) exceed limits in tests.

Currently, a chip is packaged mainly by using a Lid (e.g., a plate metal package cover) electronic component package structure. FIG. 1 shows a top view of a chip Lid electronic component package structure. FIG. 2 shows a schematic diagram of a cross-sectional structure of the chip Lid electronic component package structure shown in FIG. 1 along a direction of A-A'. As can be known from FIG. 1 and FIG. 2, by opening a window in a solder mask 3, circuit pins 2 of a chip (e.g., a Die) 1 are connected to a substrate 4, so that the chip 1 is attached to the substrate 4. A conductive lid 5 is bonded to an edge of the substrate 4 by using a non-conductive adhesive 6 having a low Dielectric Constant (DK), so that a shielding space is formed between the conductive lid 5 and the substrate to implement stress protection for the chip 1. FIG. 3 shows a schematic diagram of a coating pattern of the non-conductive adhesive 6 on the substrate. As can be known from FIG. 3, the non-conductive adhesive 6 is applied at the edge of the substrate, and an air hole 8 is disposed, where the air hole 8 is used for ventilation of the shielding space. Further, a top of the conductive lid 5 is bonded to the chip 1 by using a thermally conductive adhesive 7 to implement heat conduction for the chip 1.

According to the foregoing used Lid electronic component package structure, the low-DK non-conductive adhesive disposed between the conductive lid 5 and the substrate, causes the conductive lid to present high impedance relative to the substrate. The high impedance causes a non-conductive adhesive slot between the conductive lid and the substrate to become a radiation structure having a great slot antenna effect. Due to the radiation structure having a slot antenna effect, the indirectly electrically connected shielding space formed between the conductive lid and the substrate does not have a good shielding effect on the high-frequency EMI generated by the chip, although the shielding space can have a good heat conduction effect and provide stress protection for the chip in the shielding space.

SUMMARY

Embodiments of the present disclosure provide an electronic component package structure and an electronic device to improve an EMI shielding effect.

According to a first aspect, an electronic component package structure is provided, and includes a substrate, a conductive lid, and a non-conductive adhesive, where the substrate has a set attachment area for attaching an electronic component; the conductive lid has a top and a sidewall that extends toward the substrate, where one side of the sidewall close to the substrate has a bonding end, where the bonding end bonds the conductive lid to the substrate by using the non-conductive adhesive, and the conductive lid bonded to the substrate encloses the attachment area and forms a shielding space over the attachment area; and the non-conductive adhesive is located between the substrate and the bonding end, and has a DK not less than 7 and a coating thickness not greater than 0.07 millimeters (mm).

With reference to the first aspect, in a first implementation manner, the bonding end occupies all areas except the attachment area on a surface of one side of the substrate facing the conductive lid, and all the areas occupied by the bonding end on the substrate are coated with the non-conductive adhesive.

With reference to the first aspect or the first implementation manner of the first aspect, in a second implementation manner, the electronic component package structure further includes a solder mask disposed on the surface of the one side of the substrate facing the conductive lid; and in the solder mask, an open window is disposed in a position in which the non-conductive adhesive is disposed.

With reference to the first aspect, the first implementation manner of the first aspect, or the second implementation manner of the first aspect, in a third implementation manner, the non-conductive adhesive has a closed non-conductive adhesive pattern.

With reference to the third implementation manner of the first aspect, in a fourth implementation manner, a circular, quasi-circular, or polygonal air hole is disposed in the sidewall of the conductive lid.

With reference to the first aspect, the first implementation manner of the first aspect, or the second implementation manner of the first aspect, in a fifth implementation manner, an air hole is disposed in the non-conductive adhesive; and a width of the air hole along a planar direction of the substrate is not greater than 3 mm.

With reference to the fifth implementation manner of the first aspect, in a sixth implementation manner, the solder mask is disposed on the surface of the one side of the substrate facing the conductive lid, and in the solder mask, an open window is disposed in a position in which the air hole is disposed.

With reference to any implementation manner of the foregoing various implementation manners provided by the first aspect, in a seventh implementation manner, in addition to the non-conductive adhesive, a dielectric structure forming a filter structure is further disposed between the bonding end and the substrate, where the dielectric structure includes an electromagnetic band gap (EBG) and an embedded capacitor.

With reference to any implementation manner of the foregoing various implementation manners provided by the first aspect, in an eighth implementation manner, in addition to the non-conductive adhesive, a dielectric structure forming a planar capacitance structure is further disposed between the conductive lid and the substrate, where the dielectric structure includes an EBG and an embedded capacitor.

With reference to the first aspect, in a ninth implementation manner, the electronic component is a chip or a discrete component.

With reference to the first aspect, in a tenth implementation manner, the electronic component is a chip and a discrete component.

According to a second aspect, an electronic device is provided, and the electronic device includes a circuit board, an electronic component package structure, and an electronic component, where the circuit board has an electronic circuit; the electronic package structure is any electronic component package structure provided by the first aspect, and the electronic component package structure is electrically connected to the circuit board by using a substrate; the electronic component is attached to a set attachment area in the electronic package structure, and electrically connected to the electronic circuit of the circuit board by using the electronic package structure; and a conductive lid bonded to the substrate by using a non-conductive adhesive in the electronic package structure performs EMI shielding for the electronic component.

According to the electronic component package structure and the electronic device provided by the embodiments of the present disclosure, a non-conductive adhesive for bonding a conductive lid to a substrate has a DK not less than 7 and a coating thickness not greater than 0.07 mm. Therefore, planar capacitance intensity of a planar capacitance structure formed by the conductive lid, the non-conductive adhesive, and the substrate is increased, and further, planar capacitance of the planar capacitance structure formed by the conductive lid, the non-conductive adhesive, and the substrate can be increased. Therefore, EMI radiated due to a slot antenna effect at the non-conductive adhesive can be reduced effectively, and an EMI shielding effect of a shielding space formed between the conductive lid and the substrate can be improved.

DESCRIPTION OF EMBODIMENTS

The embodiments of the present disclosure provide an electronic component package structure having an EMI shielding effect. By increasing planar capacitance intensity of a planar capacitance structure formed by a conductive lid, a non-conductive adhesive, and a substrate, and increasing planar capacitance of the planar capacitance structure formed by the conductive lid, the non-conductive adhesive, and the substrate, EMI radiated due to a slot antenna effect at the non-conductive adhesive can be reduced effectively, and an EMI shielding effect of a shielding space formed between the conductive lid and the substrate can be improved.

The following clearly describes the technical solutions in the embodiments of the present disclosure with reference to the accompanying drawings in the embodiments of the present disclosure. The described embodiments are only a part rather than all of the embodiments of the present disclosure. All other embodiments obtained by a person of ordinary skill in the art based on the embodiments of the present disclosure without creative efforts shall fall within the protection scope of the present disclosure.

Embodiment 1

Figure 4:
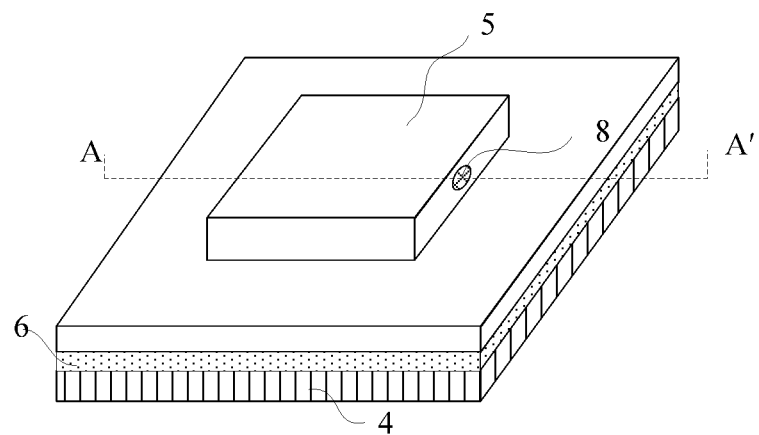
FIG. 4 is a top view of an electronic component package structure according to a first embodiment of the present disclosure.
Figure 5:
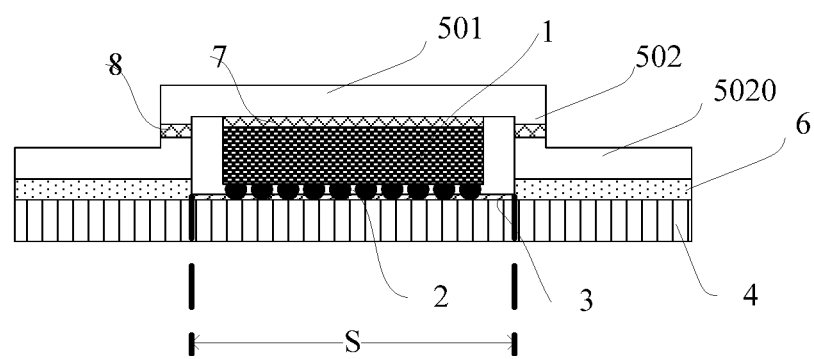
FIG. 5 is a schematic diagram of a cross-sectional structure of an electronic component package structure according to the first embodiment of the present disclosure.

FIG. 4 shows a top view of an electronic component package structure having an EMI shielding effect according to this embodiment of the present disclosure; FIG. 5 shows a schematic diagram of a cross-sectional structure of the electronic component package structure shown in FIG. 4 along a direction of A-A'. As can be known from FIG. 4 and FIG. 5, the electronic component package structure provided by this embodiment of the present disclosure includes an electronic component (e.g., a chip or a discrete component) 1, circuit pins 2, a solder mask 3, a substrate 4, a conductive lid 5, a non-conductive adhesive 6 disposed between the substrate 4 and the conductive lid 5, and a thermally conductive adhesive 7.

The substrate 4 has a set attachment area S for attaching an electronic component, where a size and a shape of the attachment area S may be set according to a size and a shape of an actually packaged electronic component. Certainly, to avoid contact between the attached electronic component and the non-conductive adhesive 6, the attachment area S may be set to be slightly greater than the size of the electronic component, so that a gap exists between the electronic component and the non-conductive adhesive, where the gap should be as small as possible.

The conductive lid 5 has a top 501 and a sidewall 502 that extends toward the substrate, where one side of the sidewall close to the substrate has a bonding end 5020, where the bonding end 5020 bonds the conductive lid 5 to the substrate 4 using the non-conductive adhesive 6, and the conductive lid 5 bonded to the substrate 4 encloses the attachment area S set on the substrate 4 and forms a shielding space over the attachment area S to implement stress protection for the electronic component 1 attached to the substrate.

The non-conductive adhesive 6 is disposed between the substrate and the bonding end and configured to bond the conductive lid 5 to the substrate 4, and has a DK not less than 7 and a coating thickness not greater than 0.07 mm.

In this embodiment of the present disclosure, the DK of the non-conductive adhesive 6 is not less than 7. Therefore, in comparison with a conventional low-DK non-conductive adhesive, the non-conductive adhesive 6 in this embodiment of the present disclosure is a high-DK non-conductive adhesive. In this embodiment of the present disclosure, a high-DK non-conductive adhesive, instead of a low-DK non-conductive adhesive in a conventional electronic component package structure, is used, which can increase planar capacitance intensity of a planar capacitance structure formed by the conductive lid 5, the non-conductive adhesive 6, and the substrate 4. The present disclosure can increase planar capacitance of the planar capacitance structure formed by the conductive lid, the non-conductive adhesive, and the substrate, and help to improve an EMI shielding effect of the shielding space formed between the conductive lid and the substrate. In this embodiment of the present disclosure, preferably, the DK of the non-conductive adhesive is not less than 7. For example, the DK of the non-conductive adhesive in this embodiment of the present disclosure may be 8 or 10.

It should be noted that shapes of the conductive lid 5 shown in FIG. 4 and FIG. 5 in this embodiment of the present disclosure are used only for exemplary description, and are not limited. For example, the shapes may also be shapes shown in FIG. 7 and FIG. 8.

Further, it should be noted that in FIG. 4 and FIG. 5 in this embodiment of the present disclosure, an example in which the electronic component is a chip is used for description. Certainly, the electronic component may also be another electronic component, for example, a discrete component such as a capacitor.

According to the electronic component package structure provided by this embodiment of the present disclosure, the high-DK non-conductive adhesive that can increase the planar capacitance intensity of the planar capacitance structure formed by the conductive lid, the non-conductive adhesive, and the substrate is disposed to bond the conductive lid to the substrate. As can be known according to a capacitance calculation formula $C=\varepsilon s/4\pi kd$, where d represents a distance between battery lead plates, s represents an overlap area of the battery lead plates, and $\varepsilon$ represents a DK, the high-DK non-conductive adhesive for bonding the conductive lid to the substrate in this embodiment of the present disclosure is equivalent to increasing $\varepsilon$, and therefore, the planar capacitance of the planar capacitance structure formed by the conductive lid, the non-conductive adhesive, and the substrate can be increased. In addition, in this embodiment of the present disclosure, the coating thickness of the non-conductive adhesive is not greater than 0.07, so that parasitic inductance of the conductive lid relative to the substrate is reduced. Further, EMI radiated due to a slot antenna effect at the non-conductive adhesive can be reduced effectively, and the EMI shielding effect of the shielding space formed by the planar capacitance structure formed by the conductive lid, the non-conductive adhesive, and the substrate can be improved.

Figure 1:
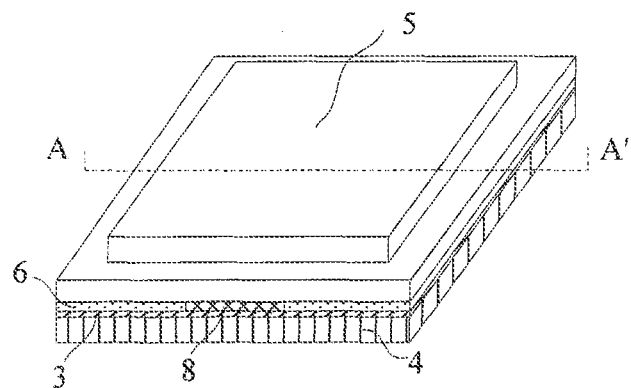
FIG. 1 is a top view of an electronic component package structure.
Figure 2:
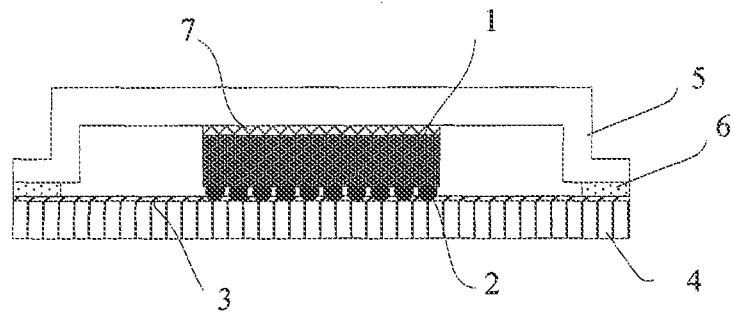
FIG. 2 is a schematic diagram of a cross-sectional structure of an electronic component package structure.
Figure 3:
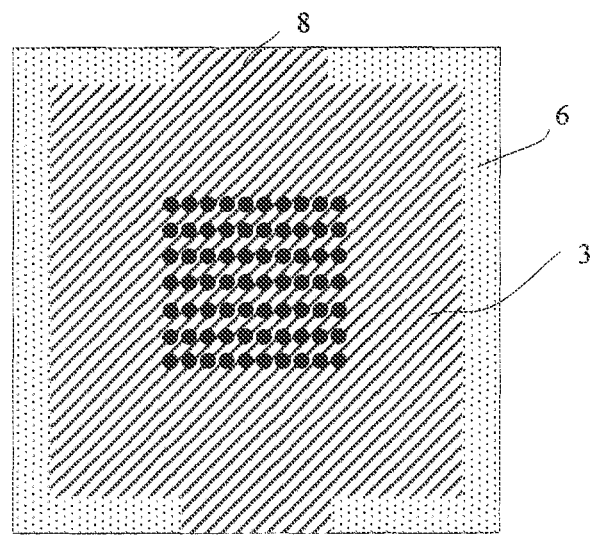
FIG. 3 is a schematic diagram of a coating pattern of a non-conductive adhesive.
Figure 6:
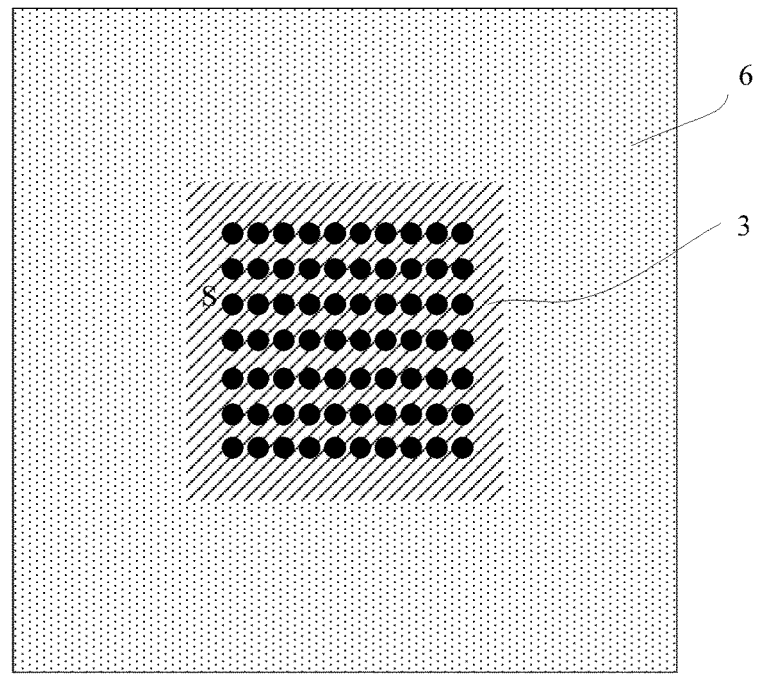
FIG. 6 is a schematic diagram of a coating pattern of a non-conductive adhesive according to the first embodiment of the present disclosure.

Further, in this embodiment of the present disclosure, the bonding end occupies all areas except the attachment area on a surface of one side of the substrate facing the conductive lid, and all the areas occupied by the bonding end on the substrate are coated with the non-conductive adhesive. In other words, in comparison with the conventional electronic component package structure, in this embodiment of the present disclosure, an overlap area between the bonding end of the sidewall of the conductive lid 5 and the substrate 4 is increased, and all the areas occupied by the bonding end on the substrate 4 are coated with the high-DK non-conductive adhesive for bonding the conductive lid 5 to the substrate 4. As shown in FIG. 6, in comparison with the conventional non-conductive adhesive coating manner (as shown in FIG. 3), the high-DK non-conductive adhesive coating manner shown in FIG. 6 can increase a coating area of the high-DK non-conductive adhesive. Likewise, as can be known according to the capacitance calculation formula $C=\varepsilon s/4\pi kd$, in this embodiment of the present disclosure, all areas except the set attachment area S are coated with the high-DK non-conductive adhesive, and therefore, the coating area of the high-DK non-conductive adhesive is increased, and further the planar capacitance of the planar capacitance structure formed by the conductive lid, the non-conductive adhesive, and the substrate can be increased. Further, the shielding effect of the shielding space formed between the conductive lid and the substrate is improved.

Still further, in this embodiment of the present disclosure, the electronic component package structure further includes the solder mask 3 disposed on the surface of the one side of the substrate facing the conductive lid. In comparison with the conventional electronic component package structure, in this embodiment of the present disclosure, in the solder mask 3, an open window is disposed in an area coated with the non-conductive adhesive, that is, the solder mask in a position coated with the high-DK non-conductive adhesive on the substrate is removed.

The solder mask 3 is generally a low-DK green solder mask. The low-DK solder mask 3 is disposed at the high-DK non-conductive adhesive, which can reduce the planar capacitance intensity of the planar capacitance structure formed by the conductive lid, the non-conductive adhesive, and the substrate, and further increase a distance between the bonding end of the conductive lid and the substrate. As can be known according to the capacitance calculation formula $C=\varepsilon s/4\pi kd$, the solder mask disposed at the high-DK non-conductive adhesive can reduce planar coupling capacitance of the planar capacitance structure formed by the conductive lid, the non-conductive adhesive, and the substrate. Therefore, in this embodiment of the present disclosure, in the solder mask, the open window is disposed in the area coated with the non-conductive adhesive, which can further increase the planar capacitance of the planar capacitance structure formed by the conductive lid, the non-conductive adhesive, and the substrate. Therefore, EMI radiated due to a slot antenna effect at the non-conductive adhesive can be reduced effectively, and the EMI shielding effect of the shielding space formed between the conductive lid and the substrate can be improved.

Preferably, in this embodiment of the present disclosure, to increase the planar capacitance of the planar capacitance structure formed by the conductive lid, the non-conductive adhesive, and the substrate, a coating thickness set for the high-DK non-conductive adhesive is required to be as thin as possible, for example, not greater than 0.07 mm. A smaller thickness of the high-DK non-conductive adhesive indicates larger planar capacitance intensity of the planar capacitance structure formed by the conductive lid, the non-conductive adhesive, and the substrate is greater. For example, in this embodiment of the present disclosure, if the DK of the non-conductive adhesive 6 is 10 and the coating thickness is 0.07 mm, the capacitance intensity of the planar capacitance structure formed by the conductive lid, the non-conductive adhesive, and the substrate may exceed 75 picofarads per square centimeter ($pF/cm^2$); if the DK of the non-conductive adhesive is 8 and the coating thickness is 0.06 mm, the capacitance intensity of the planar capacitance structure formed by the conductive lid, the non-conductive adhesive, and the substrate may also exceed 75 $pF/cm^2$.

It should be noted that in this embodiment of the present disclosure, the coating thickness of the non-conductive adhesive 6 is set to be not greater than 0.07 mm, which can reduce the parasitic inductance of the conductive lid relative to the substrate, reduce EMI radiated due to a slot antenna effect at the non-conductive adhesive more effectively, and improve the EMI shielding effect of the shielding space formed between the conductive lid and the substrate.

Further, in this embodiment of the present disclosure, a closed conductive adhesive pattern is preferably used as a coating pattern of the high-DK non-conductive adhesive on the substrate. Reference may be made to FIG. 6 again. In comparison with a coating pattern of the conventional low-DK non-conductive adhesive (as shown in FIG. 3), in the coating pattern of the high-DK non-conductive adhesive shown in FIG. 6 of this embodiment of the present disclosure, an air hole is not disposed in the non-conductive adhesive in this embodiment of the present disclosure, which can further avoid slot field leakage, and further improve the EMI shielding effect of the shielding space formed between the conductive lid and the substrate.

Preferably, to implement ventilation of the shielding space, in this embodiment of the present disclosure, a circular air hole 8 is disposed in the conductive lid 5. Certainly, a shape of the air hole is not limited to a circle, for example, may also be a quasi-circular air hole (an air hole similar to a circle), or a polygonal air hole such as a rectangle. In this embodiment of the present disclosure, the air hole 8 is disposed in the sidewall of the conductive lid 5, as shown in FIG. 4, FIG. 5, FIG. 7, and FIG. 8.

In this embodiment of the present disclosure, the air hole 8 is disposed on the sidewall of the conductive lid 5 that extends toward the substrate, but is not disposed on a top of the conductive lid 5, which can avoid an impact of a radiator disposed on the top of the conductive lid, on disposing the air hole. Further, in this embodiment of the present disclosure, the air hole disposed in the sidewall of the conductive lid 5 is preferably a circular air hole or a quasi-circular air hole. In comparison with a bar air hole disposed in the conventional non-conductive adhesive, a cross-sectional area is larger and ventilation is better. In addition, in comparison with an original air hole that has a larger width and is disposed in the non-conductive adhesive, the circular air hole has smaller slot field leakage.

Embodiment 2

In this embodiment of the present disclosure, a chip may be attached to an attachment area set on a substrate 4, and another discrete component, for example, an electronic component such as a capacitor, a resistor, or a transistor, may also be disposed in the attachment area.

Figure 7:
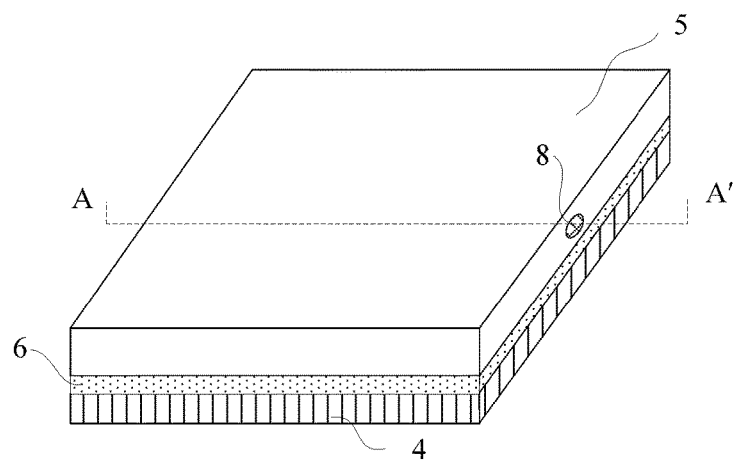
FIG. 7 is a top view of an electronic component package structure according to a second embodiment of the present disclosure.
Figure 8:
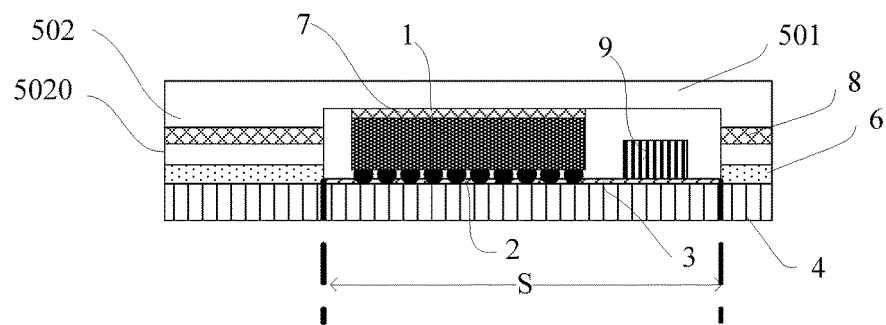
FIG. 8 is a schematic diagram of a cross-sectional structure of an electronic component package structure according to the second embodiment of the present disclosure.

With respect to an electronic component package structure provided by this embodiment of the present disclosure, an electronic component package structure in which a chip, a discrete component, or a chip and a discrete component are attached to the attachment area set on the substrate 4 is basically the same as that in the foregoing embodiment. That is, a non-conductive adhesive has a high DK value, and a coating area of the high-DK non-conductive adhesive on the substrate is as large as possible. The coating in all areas except the attachment area on a surface of one side of the substrate facing a conductive lid is required to be thin, and a solder mask is removed in a position in which the high-DK non-conductive adhesive is applied, that is, in the solder mask, an open window is disposed in the position in which the high-DK non-conductive adhesive is applied. In addition, a small-size air hole is disposed in the conductive lid. For details, refer to FIG. 7 and FIG. 8. FIG. 7 is a top view of an electronic component package structure in which a chip and a discrete component are disposed in an attachment area of a substrate according to this embodiment of the present disclosure; FIG. 8 shows a schematic diagram of a cross-sectional structure of the electronic component package structure shown in FIG. 7 along a direction of A-A' according to this embodiment of the present disclosure.

The following briefly describes the electronic component package structure in which a chip and a discrete component are attached to the attachment area set on the substrate 4 according to this embodiment of the present disclosure.

Figure 9:
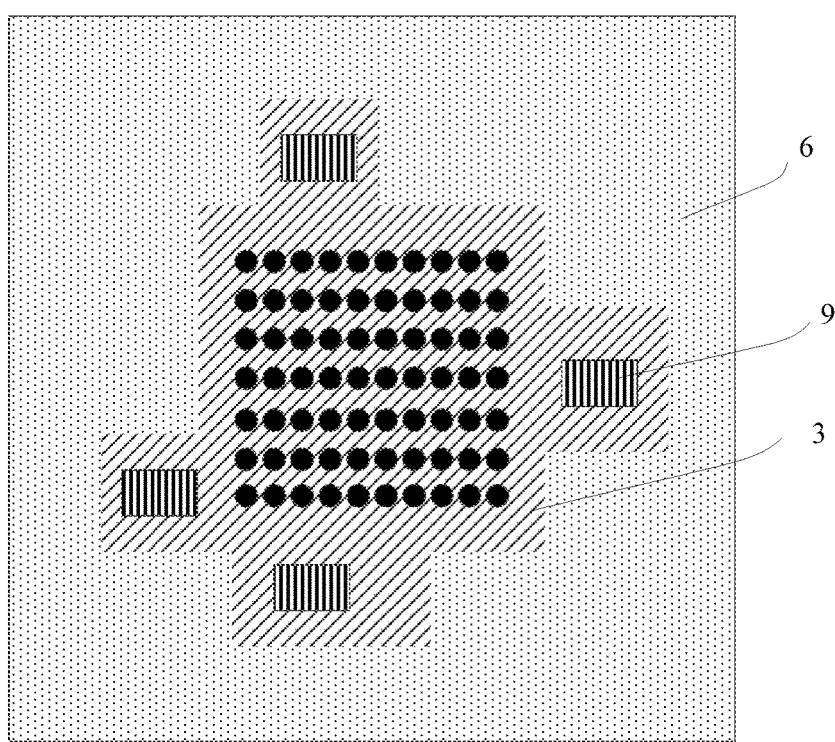
FIG. 9 is a schematic diagram of a coating pattern of a non-conductive adhesive according to the second embodiment of the present disclosure.

FIG. 8 shows a schematic diagram of a cross section of the electronic component package structure in which another discrete component in addition to a chip is disposed in the attachment area according to this embodiment of the present disclosure. In FIG. 8, an air hole 8 is disposed in a conductive lid 5, and a reference number 9 represents a disposed discrete component. In comparison with an electronic component package structure in which no discrete component is disposed, in the electronic component package structure in which the discrete component 9 is disposed in the attachment area in this embodiment of the present disclosure, a shielding space formed between the conductive lid 5 and the substrate 4 becomes larger, and a coating pattern of the high-DK non-conductive adhesive is also changed from a regular geometric pattern to an irregular geometric pattern shown in FIG. 9. For details, refer to FIG. 9. FIG. 9 shows a coating pattern of a high-DK non-conductive adhesive when another discrete component is disposed in the attachment area according to this embodiment of the present disclosure.

The electronic component package structure having an EMI shielding effect according to this embodiment of the present disclosure not only is applicable to packaging of a discrete chip, but also is applicable to mixed packaging of discrete components and multiple chips. Therefore, it is applicable in a wide scope.

Still further, in addition to the non-conductive adhesive, another dielectric structure forming a filter structure may be further disposed between a bonding end of the conductive lid 5 and the substrate 4, where the dielectric structure forming the filter structure may be an EBG, an embedded capacitor, or the like. Certainly, the dielectric structure forming the filter structure in this embodiment of the present disclosure is not limited to the EBG or the embedded capacitor.

Certainly, in this embodiment of the present disclosure, in addition to the non-conductive adhesive, another dielectric structure forming a planar capacitance structure may be further disposed between the bonding end of the conductive lid and the substrate, where the dielectric structure may be an EBG, an embedded capacitor, or the like. Certainly, the dielectric structure forming the planar capacitance structure in this embodiment of the present disclosure is not limited to the EBG or the embedded capacitor.

Embodiment 3

Figure 10:
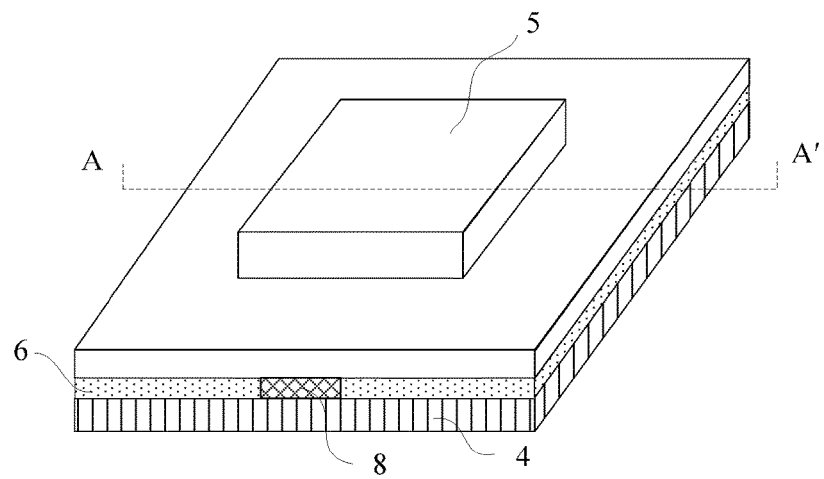
FIG. 10 is a top view of an electronic component package structure according to a third embodiment of the present disclosure.
Figure 11:
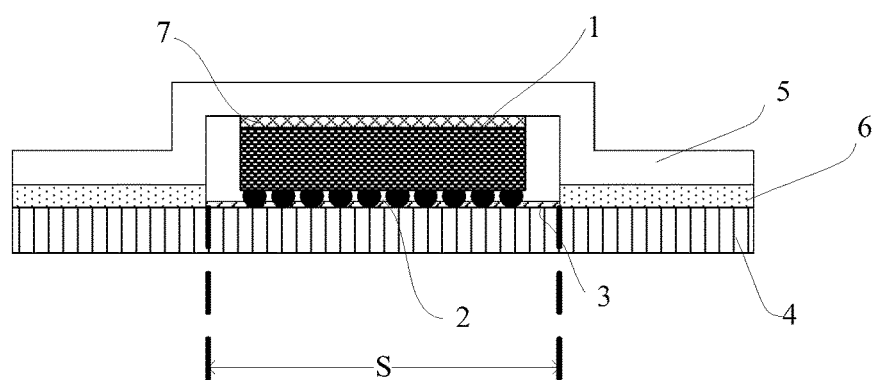
FIG. 11 is a schematic diagram of a cross-sectional structure of an electronic component package structure according to the third embodiment of the present disclosure.

In this embodiment of the present disclosure, to ensure process reliability, an air hole 8 may be reserved in a high-DK non-conductive adhesive, that is, an air hole is disposed in the high-DK non-conductive adhesive. Reference may be made to FIG. 10 and FIG. 11. FIG. 10 shows a top view of an electronic component package structure in which an air hole is disposed in a high-DK non-conductive adhesive according to this embodiment of the present disclosure; FIG. 11 shows a schematic diagram of a cross-sectional structure of the electronic component package structure shown in FIG. 10 along a direction of A-A'.

A difference between the electronic component package structure involved in this embodiment of the present disclosure and that in the foregoing embodiment lies in a position in which the air hole is disposed. The following describes only the difference in this embodiment of the present disclosure, and other same or similar aspects are not described herein again. Reference may be made to the description of the electronic component package structure shown in FIG. 4 and FIG. 5.

In this embodiment of the present disclosure, a width of the air hole 8 disposed in the high-DK non-conductive adhesive along a planar direction of a substrate is preferably not greater than 3 mm, to reduce slot field leakage on a basis of ensuring process reliability.

Figure 12:
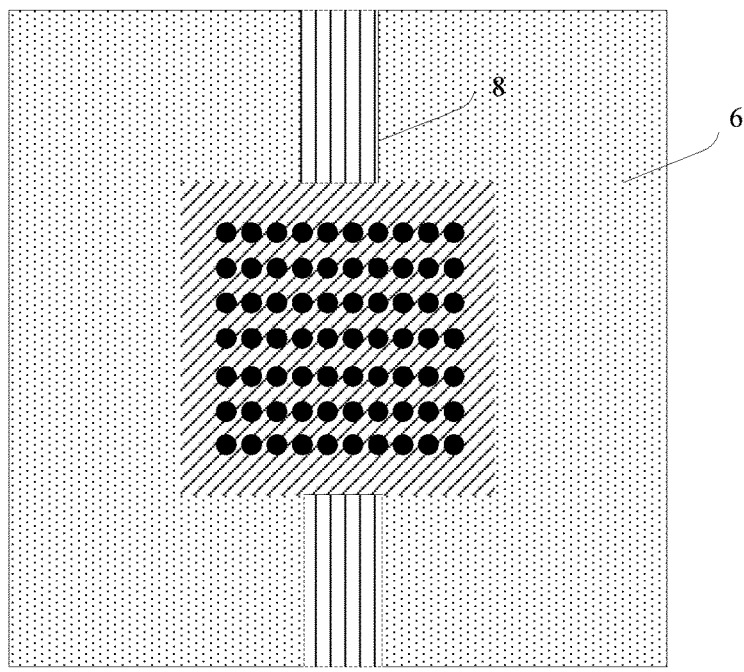
FIG. 12 is a schematic diagram of a coating pattern of a non-conductive adhesive according to the third embodiment of the present disclosure.

Further, to increase ventilation of the air hole 8 in this embodiment of the present disclosure, in a solder mask 3 disposed on the substrate, an open window is disposed in a position in which the air hole is disposed, as shown in FIG. 12. FIG. 12 is a coating pattern of a non-conductive adhesive when a small air hole is disposed in the high-DK non-conductive adhesive according to this embodiment of the present disclosure. A small air hole is disposed in the non-conductive adhesive; therefore, the coating pattern of the non-conductive adhesive is an unclosed pattern.

According to the electronic component package structure provided by this embodiment of the present disclosure, the small air hole 8 is disposed in the high-DK non-conductive adhesive, and a small air hole may be disposed on a basis of an original manufacturing process. Therefore, process modification is small and process reliability can be improved.

Embodiment 4

Figure 13:
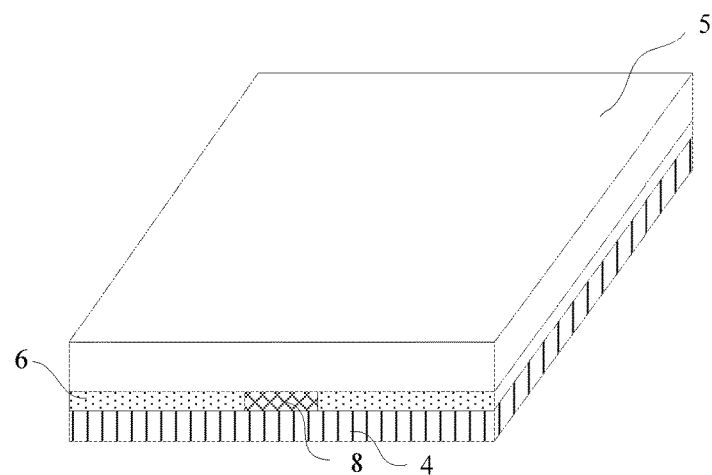
FIG. 13 is a top view of an electronic component package structure according to a fourth embodiment of the present disclosure.
Figure 14:
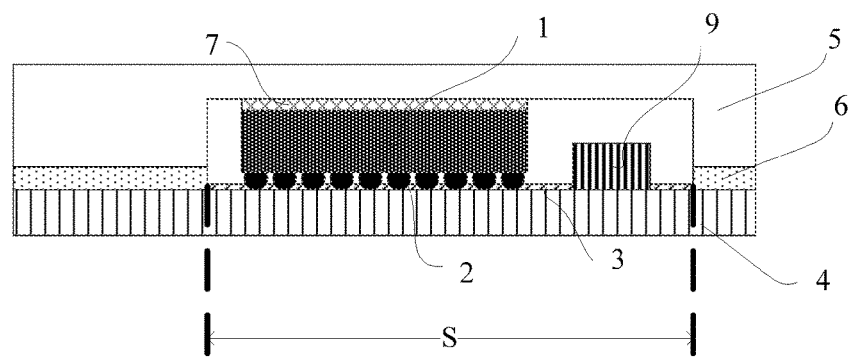
FIG. 14 is a schematic diagram of a cross-sectional structure of an electronic component package structure according to the fourth embodiment of the present disclosure.

In this embodiment of the present disclosure, a chip may be attached in an attachment area set on a substrate 4, and another discrete component, for example, an electronic component such as a capacitor, a resistor, or a transistor, may also be disposed in the attachment area, and further, a chip and a discrete component may be attached in the attachment area. With respect to an electronic component package structure provided by this embodiment of the present disclosure, an electronic component package structure in which a chip, a discrete component, or a chip and a discrete component are attached is basically the same as that in the foregoing embodiment. That is, a non-conductive adhesive has a high DK value, and a coating area of the high-DK non-conductive adhesive on the substrate is as large as possible. The coating in all areas except the attachment area is required to be thin, and a solder mask is removed in a position in which the high-DK non-conductive adhesive is applied, that is, in the solder mask, an open window is disposed in the position in which the high-DK non-conductive adhesive is applied. In addition, a small-size air hole is disposed in the non-conductive adhesive. Reference may be made to FIG. 13 and FIG. 14. FIG. 13 is a top view of an electronic component package structure in which a chip and a discrete component are disposed in an attachment area of a substrate according to this embodiment of the present disclosure. FIG. 14 shows a schematic diagram of a cross-sectional structure of the electronic component package structure shown in FIG. 13 along a direction of A-A' according to this embodiment of the present disclosure.

The following briefly describes the electronic component package structure in which a chip and a discrete component are attached to the attachment area set on the substrate 4 according to this embodiment of the present disclosure.

Figure 15:
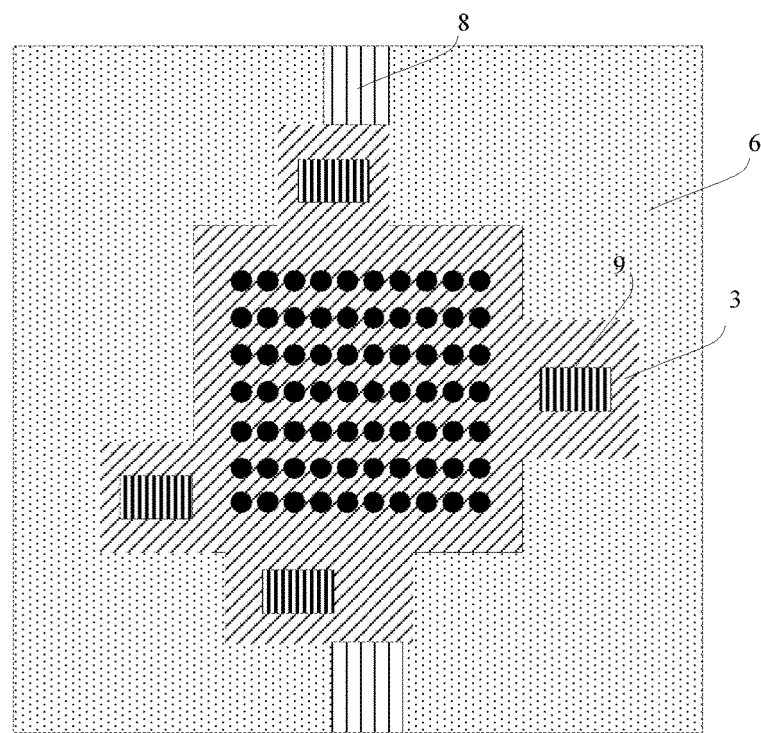
FIG. 15 is a schematic diagram of a coating pattern of a non-conductive adhesive according to the fourth embodiment of the present disclosure.

FIG. 14 shows a schematic diagram of a cross section of an electronic component package structure in which a discrete component in addition to a chip is disposed in an attachment area according to this embodiment of the present disclosure. In FIG. 14, a reference number 1 represents the disposed chip, and a reference number 9 represents the disposed discrete component, and an air hole 8 is disposed in a non-conductive adhesive 6. In comparison with an electronic component package structure in which only one electronic component is disposed, in the electronic component package structure in which the chip and the discrete component 9 are disposed in the attachment area in this embodiment of the present disclosure, a coating pattern of a high-DK non-conductive adhesive is changed from a regular geometric pattern shown in FIG.12 12 into an irregular geometric pattern shown in FIG. 15. For details, refer to FIG. 15, and details are not described again in this embodiment of the present disclosure. FIG. 15 is a coating pattern of a non-conductive adhesive when a via hole is disposed in the non-conductive adhesive and a discrete component and a chip are attached to an attachment area according to this embodiment of the present disclosure.

The electronic component package structure provided by this embodiment of the present disclosure is applicable to packaging of an electronic component package structure in which only a chip is attached, and is also applicable, and is further applicable to mixed packaging of discrete components and multiple chips. Therefore, it is applicable in a wide scope.

Still further, in addition to the non-conductive adhesive, another dielectric structure forming a filter structure may be further disposed between a conductive lid 5 and the substrate 4, where the dielectric structure forming the filter structure may be an EBG, an embedded capacitor, or the like. Certainly, the dielectric structure forming the filter structure in this embodiment of the present disclosure is not limited to the EBG or the embedded capacitor.

Certainly, in this embodiment of the present disclosure, in addition to the non-conductive adhesive, another dielectric structure forming a planar capacitance structure may be further disposed between a bonding end of the conductive lid and the substrate, where the dielectric structure may be an EBG, an embedded capacitor, or the like. Certainly, the dielectric structure forming the planar capacitance structure in this embodiment of the present disclosure is not limited to the EBG or the embedded capacitor.

The electronic component package structure provided by this embodiment of the present disclosure uses a high-DK non-conductive adhesive, which cost less in comparison with a conductive adhesive formed by a mixture of conductive materials. Further, during an assembly process of an electronic component package structure, an interior of a conductive adhesive is prone to breaking and delamination, resulting in severe deterioration of a shielding effect of a shielding space and finally causing an increase of a ratio of defective products. However, with respect to the non-conductive adhesive used by the present disclosure, even if breaking and delamination occur in the non-conductive adhesive, there is no impact on the EMI shielding effect of the shielding space, and a ratio of good products is increased.

Embodiment 5

Based on the electronic component package structure provided by the foregoing embodiments, this embodiment of the present disclosure further provides an electronic device. The electronic device includes a circuit board having an electronic circuit, an electronic component package structure, and an electronic component.

The electronic package structure in this embodiment of the present disclosure is any one electronic component package structure involved in the embodiments. The electronic component package structure is electrically connected to the circuit board using a substrate. The electronic component is attached to a set attachment area in the electronic package structure, and electrically connected to the electronic circuit of the circuit board using the electronic package structure.

Figure 16:
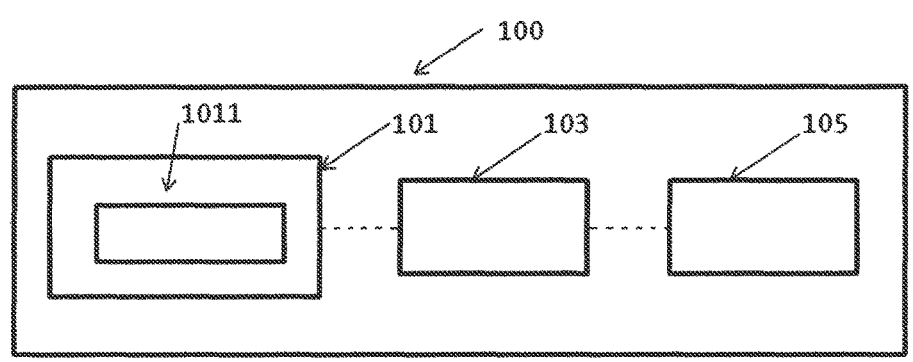
FIG. 16 is a schematic structural diagram of an electronic device according to an embodiment of the present invention.

As shown in FIG. 16, an electronic device 100 may include a circuit board 101 that has an electronic circuit 1011, an electronic component package structure 103 and an electronic component 105. The electronic component 105 is connected to the circuit board 101 using the electronic component package structure 103.

The electronic component package structure in the electronic device provided by this embodiment of the present disclosure is any one electronic component package structure involved in the foregoing embodiments of the present disclosure. Using the electronic component package structure provided by this embodiment of the present disclosure, the electronic component to be packaged is packaged on the circuit board, and therefore, a connection between the electronic component and the electronic circuit is implemented, and stress protection and proper EMI shielding can be implemented for the electronic component using a conductive lid of the electronic component package structure.

It should be noted that a difference between the electronic device provided by this embodiment of the present disclosure and an electronic device in the prior art lies in a difference in the electronic component package structure. For other structures, particular structures thereof are available with reference to specific application environments. Such structures are the same as structures of corresponding electronic devices in the prior art, and are not described herein again.

Further, using the electronic component package structure provided by this embodiment of the present disclosure, multiple types of electronic components may be packaged. The electronic component in this embodiment of the present disclosure may be a chip, and certainly may also be another discrete component such as a capacitor, a resistor, a transistor, or the like, and certainly, a chip and a discrete component may be packaged in combination.

The electronic component package structure having an EMI shielding effect according to this embodiment of the present disclosure not only is applicable to packaging of a discrete chip, but also is applicable to mixed packaging of discrete components and multiple chips. Therefore, it is applicable in a wide scope.

A high-DK non-conductive adhesive is used in the electronic component package structure in the electronic device provided by this embodiment of the present disclosure. Therefore, planar capacitance intensity of a planar capacitance structure formed by the conductive lid, the non-conductive adhesive, and the substrate is increased, and further, planar capacitance of the planar capacitance structure formed by the conductive lid, the non-conductive adhesive, and the substrate can be increased. Therefore, EMI radiated due to a slot antenna effect at the non-conductive adhesive can be reduced effectively, and an EMI shielding effect of a shielding space formed between the conductive lid and the substrate can be improved. Further, a high-DK non-conductive adhesive is used in this embodiment of the present disclosure, which cost less in comparison with a conductive adhesive formed by a mixture of conductive materials. Still further, during an assembly process of an electronic component package structure, an interior of a conductive adhesive is prone to breaking and delamination, resulting in severe deterioration of a shielding effect of a shielding space and finally causing an increase of a ratio of defective products. However, with respect to the non-conductive adhesive used by the present disclosure, even if breaking and delamination occur in the non-conductive adhesive, there is no impact on the EMI shielding effect of the shielding space, and a ratio of good products is increased.

Obviously, a person skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. An electronic component package structure, comprising:
    a substrate having a set attachment area for attaching an electronic component;
    a conductive lid having a top and a sidewall that extend toward the substrate, one side of the sidewall being proximate to the substrate and having a bonding end, the bonding end bonding the conductive lid to the substrate using a non-conductive adhesive, the conductive lid bonded to the substrate enclosing the attachment area and forming a shielding space over the attachment area, the conductive lid bonded to the substrate enclosing the attachment area and forming a shielding space over the attachment area;
    the non-conductive adhesive being located between the substrate and the bonding end; and
    a solder mask disposed on a surface of one side of the substrate facing the conductive lid, the solder mask comprising a first open window disposed in a position in which the non-conductive adhesive is disposed.

2. The electronic component package structure according to claim 1, wherein an air hole is disposed in the non-conductive adhesive, and a width of the air hole along a planar direction of the substrate is not greater than 3 millimeters (mm).

3. The electronic component package structure according to claim 2, wherein in the solder mask, a second open window is disposed in a position in which the air hole is disposed.

4. The electronic component package structure according to claim 1, wherein in addition to the non-conductive adhesive, a dielectric structure forming a filter structure is further disposed between the bonding end and the substrate, and the dielectric structure comprises an electromagnetic band gap (EBG) and an embedded capacitor.

5. The electronic component package structure according to claim 1, wherein in addition to the non-conductive adhesive, a dielectric structure forming a planar capacitance structure is further disposed between the bonding end and the substrate, and the dielectric structure comprises an electromagnetic band gap (EBG) and an embedded capacitor.

6. An electronic device, comprising:
a circuit board having an electronic circuit;
an electronic component package structure comprising at least a substrate, a conductive lid, and a non-conductive adhesive, the substrate having a set attachment area for attaching an electronic component, the conductive lid having a top and a sidewall that extend toward the substrate, one side of the sidewall being proximate to the substrate and having a bonding end, the bonding end bonding the conductive lid to the substrate using the non-conductive adhesive, the conductive lid bonded to the substrate enclosing the attachment area and forming a shielding space over the attachment area, the non-conductive adhesive being located between the substrate and the bonding end, the electronic component package structure being electrically coupled to the circuit board using the substrate, the electronic component being attached to a set attachment area in the electronic package structure, and being electrically coupled to the electronic circuit of the circuit board using the substrate of the electronic package structure, the conductive lid bonding to the substrate using the non-conductive adhesive in the electronic package structure performing electromagnetic interference shielding for the electronic component, the electronic component package structure further comprising a solder mask disposed on a surface of one side of the substrate facing the conductive lid, and a first open window being disposed in a position in the solder mask in which the non-conductive adhesive is disposed.

7. The electronic device according to claim 6, wherein an air hole is disposed in the non-conductive adhesive, and a width of the air hole along a planar direction of the substrate is not greater than 3 millimeters (mm).

8. The electronic device according to claim 7, wherein in the solder mask, a second open window is disposed in a position in which the air hole is disposed.

9. The electronic device according to claim 6, wherein in addition to the non-conductive adhesive, a dielectric structure forming a filter structure is further disposed between the bonding end and the substrate, and the dielectric structure comprises an electromagnetic band gap (EBG) and an embedded capacitor.

10. The electronic device according to claim 6, wherein in addition to the non-conductive adhesive, a dielectric structure forming a planar capacitance structure is further disposed between the bonding end and the substrate, and the dielectric structure comprises an electromagnetic band gap (EBG) and an embedded capacitor.

* * * * *